US009891383B2

(12) United States Patent
Dong

(10) Patent No.: US 9,891,383 B2
(45) Date of Patent: Feb. 13, 2018

(54) MONOLITHIC SILICON LASERS

(71) Applicant: Alcatel-Lucent USA, Inc., Murray Hill, NJ (US)

(72) Inventor: Po Dong, Murray Hill, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 98 days.

(21) Appl. No.: 14/579,424

(22) Filed: Dec. 22, 2014

(65) Prior Publication Data

US 2015/0378100 A1  Dec. 31, 2015

Related U.S. Application Data

(60) Provisional application No. 62/017,481, filed on Jun. 26, 2014.

(51) Int. Cl.
| | |
|---|---|
| *G02B 6/122* | (2006.01) |
| *G02B 6/13* | (2006.01) |
| *G02B 6/132* | (2006.01) |
| *G02B 6/12* | (2006.01) |
| *H01S 5/02* | (2006.01) |
| *H01S 5/10* | (2006.01) |
| *H01S 5/026* | (2006.01) |
| *H01S 5/14* | (2006.01) |

(52) U.S. Cl.
CPC ....... *G02B 6/1225* (2013.01); *G02B 6/12004* (2013.01); *G02B 6/131* (2013.01); *G02B 6/132* (2013.01); *H01S 5/021* (2013.01); *H01S 5/0218* (2013.01); *H01S 5/1032* (2013.01); *H01S 5/1064* (2013.01); *G02B 2006/12061* (2013.01); *H01S 5/026* (2013.01); *H01S 5/0268* (2013.01); *H01S 5/141* (2013.01)

(58) Field of Classification Search
CPC ...... G02B 6/1225; G02B 6/131; G02B 6/132; G02B 2006/12061
See application file for complete search history.

(56) References Cited

U.S. PATENT DOCUMENTS

| | | | |
|---|---|---|---|
| 8,428,404 B1 | 4/2013 | Shubin et al. | |
| 8,488,923 B2 * | 7/2013 | Na | G02B 6/1228 385/14 |
| 9,052,449 B2 * | 6/2015 | Sagawa | G02B 6/1223 |
| 9,134,478 B2 * | 9/2015 | Park | H01S 5/026 |
| 9,285,540 B2 * | 3/2016 | Bauters | H01L 31/105 |

(Continued)

FOREIGN PATENT DOCUMENTS

WO   2012098471 A2   7/2012

OTHER PUBLICATIONS

Fang, et al., "Electrically pumped hybrid AlGaInAs-silicon evanescent laser", Optics Express 9203, vol. 14, No. 20, Sep. 13, 2006.

(Continued)

*Primary Examiner* — John M Bedtelyon
(74) *Attorney, Agent, or Firm* — Parker Justiss, PC

(57) ABSTRACT

An apparatus comprising a substrate having a silicon waveguide thereon. The apparatus also comprises a semiconductor layer with a direct band gap. The semiconductor layer is located on a segment of the silicon waveguide and the semiconductor layer and the silicon waveguide are in a hybrid optical waveguide.

15 Claims, 7 Drawing Sheets

(56) References Cited

U.S. PATENT DOCUMENTS

2009/0245298 A1 10/2009 Sysak et al.
2015/0249318 A1* 9/2015 Fattal .................. H01S 5/343
372/44.01

OTHER PUBLICATIONS

Camacho-Aguilera, et al., "An Electrically Pumped Germanium Laser", Optics Express 11316, vol. 20, No. 10, May 7, 2012.
Cerutti, L., et al., "GaSb-Based Laser, Monolithically Grown on Silicon Substrate, Emitting at 1.55 um at Room Temperature," IEEE Phontonics Technology Letters, vol. 22, No. 8, Apr. 15, 2010, 3 pages.
Duan, G.H., et al., "10 Gb/s Integrated Tunable Hybrid III-V/Si Laser and Siicon Mach-Zehnder Modulator", ECOC Technical Digest 2012, Tu.4.E.2.pdf, 3 pages.
"ELEC 509, Advanced Photonics Technologies", [3-0-03:3], http://course.ee.ust.hk/elec509/, Spring 2011, 59 pages.
Duan, G.H., et al., "III-V on Silicon Transmitters", OM3K.4pdf, OFC/NFOEC Technical Digest 2013 OSA, 3 pages.
Dong, "Hybrid Semiconductor Lasers", filed Jun. 26, 2014, 21 pages.
"Tensile-strained, n-type Ge as a gain medium for monolithic laser integration on Si", Optics Express, vol. 15 No. 18, Sep. 3, 2007, 6 pgs.
"List of semiconductor materials", Wikipedia; Dec. 21, 2015 (last modified), 27 pgs.

* cited by examiner

MONOLITHIC SILICON LASERS

This application claims the benefit of U.S. Provisional Application Ser. No. 62/017,481 and is incorporated by reference herein in its entirety.

TECHNICAL FIELD

The invention relates, in general, to a laser apparatus and, more specifically, to a laser apparatus for photonic integrated circuits, and to methods of manufacturing the apparatus.

BACKGROUND

This section introduces aspects that may help facilitate a better understanding of the inventions. Accordingly, the statements of this section are to be read in this light and are not to be understood as admissions about what is prior art or what is not prior art.

Optical components are sometimes integrated in a single device such as a photonic integrated circuit. Integrating optical components on semiconductor substrates using well-developed semiconductor material fabrication processes offers the opportunity to produce high yield and low cost photonic integrated circuits. For instance, various optical components such as high speed modulators, photo detectors, WDM filters, polarization rotators, polarization beam splitters, variable optical attenuators, have been monolithically integrated into single silicon substrates.

SUMMARY

One embodiment is an apparatus. The apparatus comprises a substrate having a silicon waveguide thereon. The apparatus comprises a semiconductor layer with a direct band gap. The semiconductor layer is located on a segment of the silicon waveguide and the semiconductor layer and the silicon waveguide are in a hybrid optical waveguide.

In some such embodiments, the semiconductor layer can include a silicon and germanium alloy. In some such embodiments, the semiconductor layer can include germanium. In some such embodiments, the semiconductor layer can include a III-V semiconductor alloy. In any such embodiments, the silicon waveguide can be located on a planar surface of an oxide layer. In any such embodiments, the silicon waveguide can be part of a silicon substrate. In some such embodiments, the semiconductor layer can be located directly on and in contact with the silicon waveguide. In any such embodiments, the hybrid optical waveguide can be capable of providing optical amplification at wavelengths of an optical fiber communications band. In any such embodiments, a lateral width of at least one end segment of the semiconductor layer can forms a tapered end segment. In some such embodiments, both ends of the semiconductor layer can be tapered. In some such embodiments, a lateral width of a portion of the silicon waveguide laying adjacent to the tapered end segments can be tapered. Some such embodiments can further including a buffer layer located in between the semiconductor layer and the silicon waveguide, wherein the buffer layer includes at least one element also present in the semiconductor layer. In some such embodiments, when the semiconductor layer is a gallium arsenide layer, the buffer layer includes gallium, arsenic and another element of group III of the periodic table. Some such embodiments can further include a buffer layer located in between the semiconductor layer and the silicon waveguide, wherein the buffer layer includes a second III-V semiconductor alloy having a different elemental composition than the semiconductor layer. In any such embodiments, the silicon waveguide can be located within a photonic integrated circuit component.

Another embodiment is method of manufacturing an apparatus. The method comprises patterning a silicon layer to form a silicon waveguide located on a substrate. The method comprises depositing or growing a semiconductor layer with a direct band gap on a segment the silicon waveguide, the semiconductor layer and segment forming part of a hybrid optical waveguide.

Any such embodiments can further include depositing a dielectric layer on the substrate wherein the dielectric layer covers the silicon waveguide. Any such embodiments can further include patterning the dielectric layer to form a trench therein wherein the trench defines the shape of the semiconductor layer. In some such embodiments, the trench includes at least one tapered segment. In some such embodiments, the dielectric layer can be a silicon oxide layer. In some such embodiments, depositing the semiconductor layer includes depositing the direct band gap material into a trench formed in a dielectric layer located on the substrate and surrounding the silicon waveguide. Any such embodiments can further include forming a metal layer on the semiconductor layer.

BRIEF DESCRIPTION OF THE DRAWINGS

The embodiments of the disclosure are best understood from the following detailed description, when read with the accompanying FIGURES. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which.

In the Figures and text, similar or like reference symbols indicate elements with similar or the same functions and/or structures.

In the Figures, the relative dimensions of some features may be exaggerated to more clearly illustrate one or more of the structures or features therein.

Herein, various embodiments are described more fully by the Figures and the Detailed Description. Nevertheless, the inventions may be embodied in various forms and are not limited to the embodiments described in the Figures and Detailed Description of Illustrative Embodiments.

DETAILED DESCRIPTION

The description and drawings merely illustrate the principles of the inventions. It will thus be appreciated that those skilled in the art will be able to devise various arrangements that, although not explicitly described or shown herein, embody the principles of the inventions and are included within its scope. Furthermore, all examples recited herein are principally intended expressly to be for pedagogical purposes to aid the reader in understanding the principles of the inventions and concepts contributed by the inventor(s) to furthering the art, and are to be construed as being without limitation to such specifically recited examples and conditions. Moreover, all statements herein reciting principles, aspects, and embodiments of the inventions, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

The integration of lasers into silicon substrates remains challenging. For instance, as silicon is an indirect band gap material, it is difficult or impossible to make silicon lase directly in a photonic circuit. For instance, forming hybrid lasers where III-V semiconductor wafer chips are bonded to silicon wafer chips may pose problems due to wafer size mismatch, with reduced yields and reliability. Efforts to form monolithic lasers by epi-growing III-V semiconductor materials or germanium on silicon that couple to silicon waveguide directly can be problematic.

Embodiments of the disclosure facilitate the monolithic integration of lasers into a silicon photonic integrated circuit. As described herein semiconductor layer and a silicon waveguide are coupled so as to allow efficient light coupling between the semiconductor layer and the silicon waveguide in monolithic silicon laser configurations.

Figure 1A:
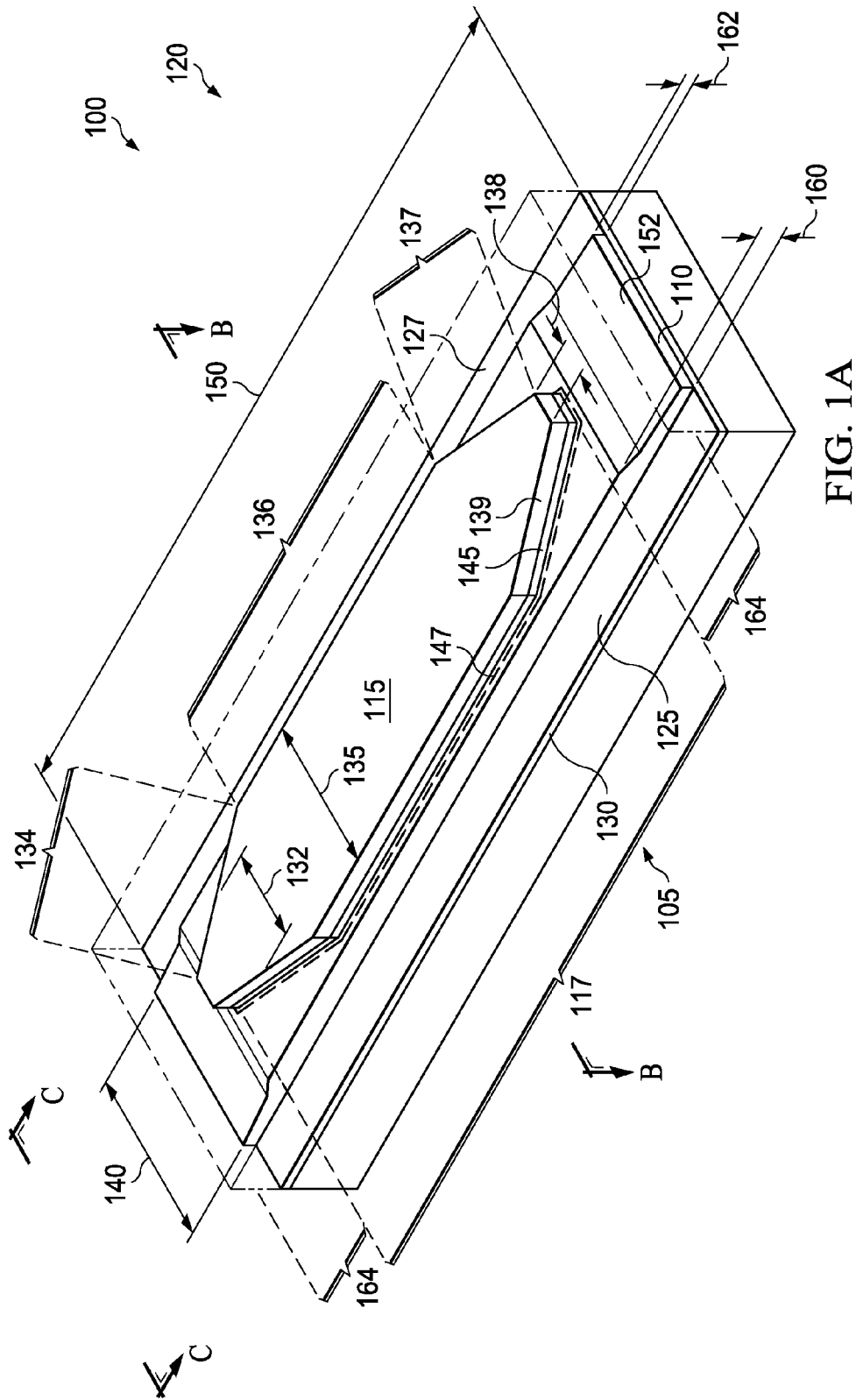
FIG. 1A presents a perspective view of an example apparatus of the present disclosure.

One embodiment is an apparatus. FIG. 1A presents a perspective view of an example embodiment apparatus 100 of the present disclosure. The apparatus 100 comprises a substrate 105 having a silicon waveguide 110 thereon. The apparatus 100 also comprises a semiconductor layer 115 with a direct band gap. The semiconductor layer 115 is located on a segment 117 of the silicon waveguide 110, and, the semiconductor layer 115 and the silicon waveguide 110 are in a hybrid optical waveguide 120.

In some embodiments, the semiconductor layer 115 can be laterally bounded by dielectric 125 (e.g., a dielectric layer such as a silicon oxide layer). In some embodiments, the dielectric 125 can beneficially serve as a side cladding for light propagating through the silicon waveguide 110 semiconductor layer 115. However, in other embodiments, the silicon waveguide 110 or the semiconductor layer 115 may not be laterally bounded by any material.

Some embodiments of the semiconductor layer 115 with a direct band gap (e.g., as an amplifier layer of gain layer) are composed of direct band gap material. The term direct band gap material as used herein refers to a semiconductor material having electrons and holes whose crystal momentum k-vectors are substantially the same in a conduction band and valence band. The direct band gap materials of the layer 115 are capable of stimulated emission under the electrical bias conditions such as used in photonic integrated circuits for electrical pumped lasers, as familiar to those skilled in the pertinent art.

In some embodiments, the direct band gap material includes a silicon and germanium alloy (SiGe) alloy. In some embodiments, the direct band gap material includes a III-V semiconductor alloy (e.g., a III-V compound semiconductor alloy). Non-limiting examples of III-V semiconductor alloys include GaN, GaAs, GaSb, InP, GaAsP, AlGaAs, AlGaInAs and InGaAsP or similar of III-V compound semiconductor alloy materials familiar to those skilled in the pertinent art. In some embodiments, the direct band gap material can include stacked layers of different III-V materials, such as, stacked layers of low band gap material (e.g., GaAs or InGaAsP of one stoichiometry) and high band gap material (e.g., AlGaAs or InGaAsP of another different stoichiometry). In some embodiment, the direct band gap material can include one or more thin layers of III-V materials to form one or more quantum well layers. Some embodiments of the semiconductor layer 115 with a direct band gap include germanium. For example, the semiconductor layer 115 of germanium can be n-doped or pure germanium that is stressed (e.g., laterally stressed) so as to have a direct band gap.

In some embodiments, the silicon waveguide 110 can be located on a planar surface 127 of an oxide layer 130 (e.g., a silicon oxide layer 130 of the substrate 105, such as a buried oxide layer of a substrate which is a silicon-on-insulator (SOI) substrate). In some embodiments, the oxide layer 130 can beneficially serve as a lower cladding for light propagating through the silicon waveguide 110. However, in other embodiments, the silicon waveguide 110 can lay on, or be part of, a silicon layer of the substrate 105 (e.g., layer 130 can be a silicon layer), and, due to the presence of the lateral ridge, the light propagating through the waveguide 110 is still substantially confined to the waveguide 110. In some embodiments, the silicon waveguide 110 can be part of a silicon substrate 105.

In some embodiments, the hybrid optical waveguide 120 is capable of providing optical amplification at wavelengths of an optical fiber communications band. For example, the optical fiber communications band can include any one of the common optical telecommunication bands, including the Original (e.g., about 1260 to about 1360 nm), Extended (e.g., about 1360 to about 1460 nm), Short (e.g., about 1460 to about 1530 nm), Conventional (e.g., about 1530 to about 1565 nm), Long (from e.g., 1565 to about 1625 nm) or Ultralong (e.g., about 1625 to about 1675) bands.

In some embodiments, to facilitate efficient light coupling between the waveguide 110 and semiconductor layer 115, a lateral width 132 of at least one end segment 134 of the semiconductor layer 115 can form a tapered end segment 134. For example, the lateral width 132 of at least one end segment 134 of the amplifier layer can be tapered relative to a lateral width 135 of a middle segment 136 of the layer 115 to form the tapered end segment 134. In some embodiments, to further facilitate efficient light coupling, both ends (e.g., end segments 134, 137) of the semiconductor layer 115 can be tapered.

Figure 1B:
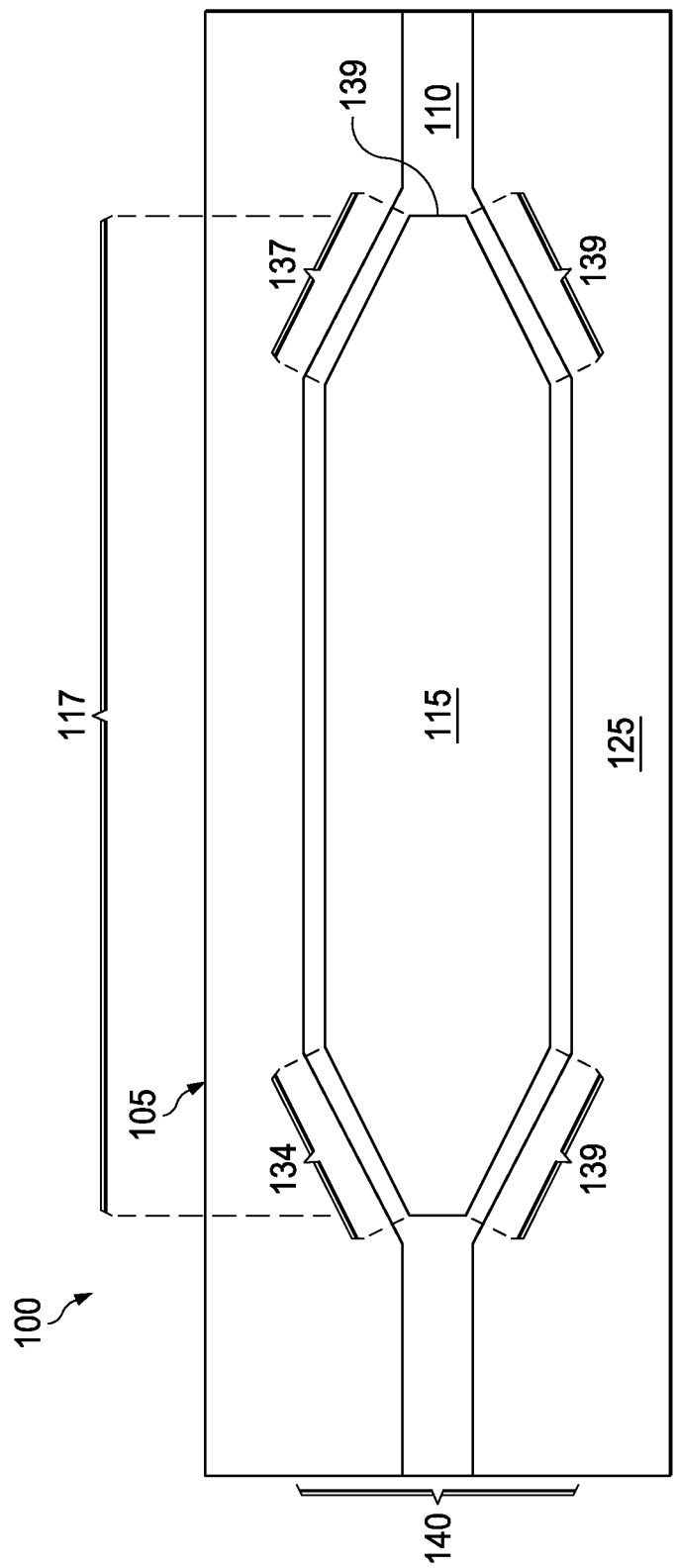
FIG. 1B presents a plan view of an alternative example of the present disclosure similar to the example apparatus shown in FIG. 1A along view line B.

FIG. 1B presents a plan view of an alternative example of the present disclosure similar to the example apparatus shown in FIG. 1A along view line B. As illustrated in FIGS. 1A and 1B, in some embodiments, to further facilitate efficient light coupling, a lateral width 140 of a portion of the silicon waveguide 110 laying adjacent to the tapered end segments 134, 137 of the semiconductor layer 115 can also be similarly tapered to provide tapered waveguide end segments 139.

As illustrated in FIG. 1A, the width 132 within the end segment 134 (or end segments 134, 137) can gradually linearly decrease from the width 135 of the semiconductor layer middle segment 136 to a smaller width 138 of a blunted tip 139 of the semiconductor layer 115. However, in other embodiments, the width 132 can decrease in a stepwise or stair-step fashion such that, e.g., there are two or more discrete width levels. In some embodiments, the width 132 can curve-linearly decrease towards the tip 139.

In some embodiments, to facilitate efficient light coupling between the waveguide 110 and semiconductor layer 115, the semiconductor layer 115 can be located directly on, and in contact, with the silicon waveguide 110.

In some embodiments, to facilitate forming the semiconductor layer 115 with a uniform crystal lattice structure and/or to facilitate the relief of crystal lattice stresses between the layers 110, 115, the apparatus 100 can further include a buffer layer 145 located in between the semiconductor layer 115 and the silicon waveguide 110. In some embodiments, the buffer layer 145 can include at least one element (e.g., element of the periodic table of elements) also present in the semiconductor layer. In some such embodiments, for example, when the semiconductor layer 115 is a gallium arsenide layer, the buffer layer 145 includes gallium, arsenic and another element of group III of the periodic table of elements such as indium.

In some such embodiments, for example, when the amplifier layer is composed of SiGe, the buffer layer 145 can be composed of Si and Ge wherein an average concentration of Si in the buffer layer 145 is intermediate a concentration of Si in the silicon waveguide 110 and a concentration of Si in the semiconductor layer 115.

Some embodiments can further include a buffer layer 145 located in between the semiconductor layer 115 and the silicon waveguide 110 where the buffer layer 145 includes a second III-V semiconductor alloy having a different elemental composition than that of the semiconductor layer 115.

In some embodiments, the silicon waveguide 110 can be located within a photonic integrated circuit component, e.g., any of high speed modulators, resonators, filters, polarization rotators, polarization beam splitters, variable optical attenuators. For example, the silicon waveguide 110 can form part of an arrayed waveguide grating of a photonic integrated circuit. In some embodiments, the apparatus 100 can be part of a laser apparatus such as a laser diode for a photonic integrated circuit. For example, in some embodiments, the hybrid optical waveguide 120, including the semiconductor layer 115 and the waveguide segment 117, can be part of a hybrid laser.

In FIG. 1A the semiconductor layer 115 is depicted as a hexagonally-shaped layer with an elongated middle segment 136. In other embodiments, the semiconductor layer 115 can have other shapes, e.g., to facilitate particular application. For example, the semiconductor layer 115, and in some embodiments, the underlying waveguide segment 117, can have a ring-shaped lateral profile parallel to the plane of the substrate such as a ring resonator shape. For example, one or more surfaces (e.g., top, bottom and or sides) of the semiconductor layer 115 and in some embodiments, the underlying waveguide segment 117 or non-underlying waveguide segments, can include gratings to facilitate efficient optical propagation of certain light wavelengths through the waveguide 110 and the layer 115 such as when the apparatus 100 is configured as, or includes, a distributed feedback (DFB) laser.

In some embodiments, to facilitate efficient optical coupling between the semiconductor layer 115 and the waveguide 110 (e.g., waveguide segment 117), the layer 115 is within a perimeter 147 bounded by a lateral width 140 of the waveguide 110 and a portion of a length 150 of a facing surface 152 of the silicon waveguide 110, e.g., of the waveguide segment 117.

In some embodiments, a thickness (e.g., vertical thickness 160 as depicted in FIG. 1A) of waveguide segment 117 substantially underlying the semiconductor layer 115 is greater than the thickness 162 of a segment 164 the waveguide 110 not underlying the layer 115. Having a greater thickness 160 of the waveguide segment 117 can facilitate efficient optical coupling by making the velocity of light travelling through the waveguide 110 and layer 115 similar than for a thinner segment. In some embodiments, the thickness 160 of the underlying waveguide segment 117 is about double the thickness 162 of the non-underlying waveguide segment 164. As illustrated in FIG. 1A, in some embodiments, to facilitate light transfer efficiency between the two different thickness segments 117, 164, there can be a gradual step between the two segments 117, 164. In other embodiments, however, there can be a sharp stair-step division between the segments 117, 164 of different thickness. As non-limiting examples, in some embodiments, the underlying waveguide segment 117 has a thickness 160 of about 400 nanometers and the non-underlying waveguide segment 164 has a thickness 162 of about 200 to 220 nanometers. In some embodiments, having the bulk of non-underlying waveguide segment 164 at a different thickness than the underlying waveguide segment 117 thickness may facilitate the efficient propagation of certain light modes through the waveguide 110.

Another embodiment of the disclosure is a method of manufacturing an apparatus. FIGS. 2A-2E present side cross-sectional views (e.g., similar to view line C, FIG. 1A) of an example apparatus 100 of the present disclosure at different stages of fabrication. FIG. 3A-3E presents plan views (view line B, FIG. 1A) the example apparatus 100 at the same stages of fabrication as depicted in FIGS. 2A-2E. FIG. 4 presents a flow diagram of an example method of manufacturing an apparatus of the disclosure, such as any of the example apparatuses 100 described in the context of FIGS. 1A-3E.

Turning to FIG. 4, with continuing reference to FIGS. 2A-3E throughout, the method comprises a step 405 of providing a silicon substrate 105 (e.g., a silicon on insulator substrate have a silicon layer 205 and buried oxide layer 130).

In some embodiments, to reduce optical losses from light scattering, the thickness 162 of the silicon layer 110 (FIG. 1A) is uniform. In some embodiments, as non-limiting examples, the waveguide 110 can have a uniform thickness 162 of about 200 nanometers, 300 nanometers or 400 nanometers and in some embodiments the thickness is the same within ±5 percent, or, in some embodiments, within ±1 percent or less, or, in some embodiments, within ±0.5 percent. In some embodiments, for example, the thickness 162 (e.g., from 200 about to 400 nanometers) for an about 1×1 micron$^2$ area of the waveguide 110 can vary by about ±5 nanometers or less, and in some embodiments about ±2.5 nanometers or less, and in some embodiments, about +0.5 nanometers.

Some embodiments of the method include a step 407 of growing a thickness of a portion of the silicon layer 205, e.g., to form a greater thickness 160 of the waveguide 110 to become the underlying waveguide segment 117 (FIG. 1A). For instance, molecular beam epitaxy (MBE), or other processes familiar to those skilled in the pertinent art, can be used to about double the thickness 160 silicon layer portion to be the waveguide segment 117 as compared to the thickness 162 of non-underlying segments 164 of the waveguide 110.

Figure 2A:
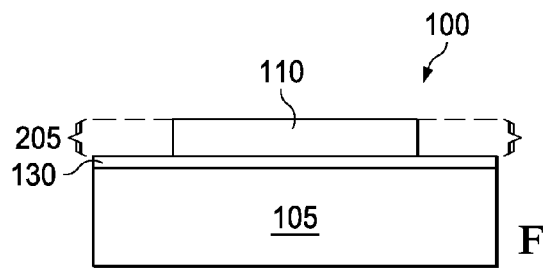
FIGS. 2A-2E present side cross-sectional views of an example apparatus of the present disclosure at different stages of fabrication similar to the example apparatus shown in FIG. 1A along view line C.
Figure 3A:
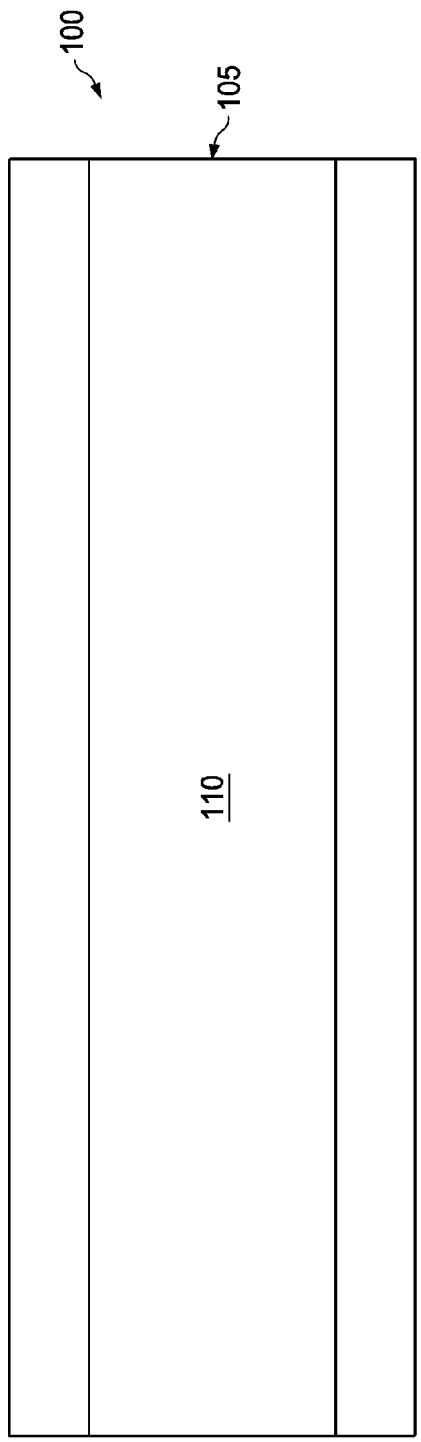
FIG. 3A-3E presents plan views of another example apparatus at the same stages of fabrication as depicted in FIGS. 2A-2D and similar to the example apparatus shown in FIG. 1A along view line B.
Figure 4:
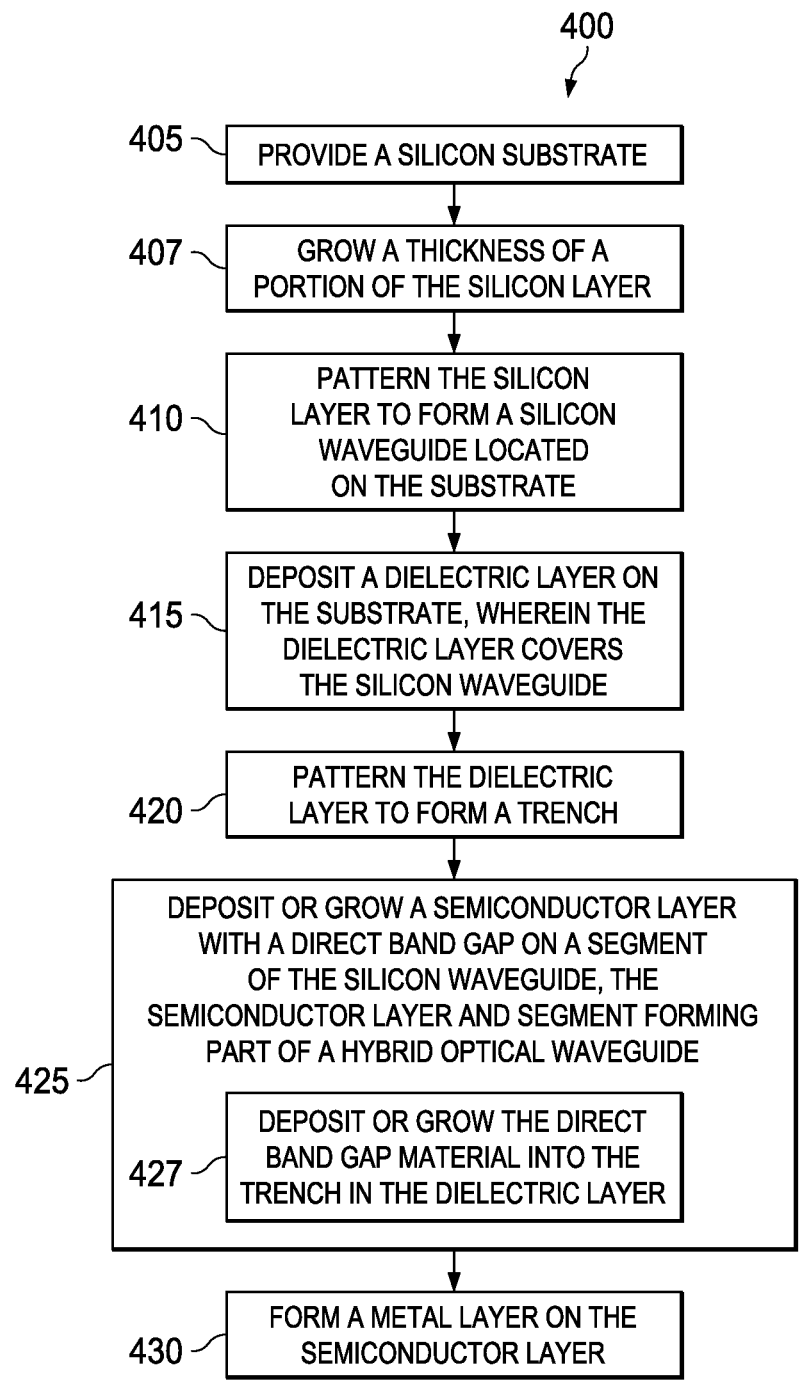
FIG. 4 presents a flow diagram of an example method of manufacturing an apparatus of the disclosure, such as any of the example apparatuses described in the context of FIGS. 1A-3E.

Embodiments of the method comprise a step 410 of patterning the silicon layer 205 to form a silicon waveguide 110 located on the substrate 105 (e.g., FIGS. 2A and 3A). The patterning step 410 can include conventional lithographic and silicon etching procedures familiar to those skilled in the pertinent art to remove portions of the silicon layer 205 laying outside of the silicon waveguide 110. In some embodiments, the patterning step 410 can further include forming one or more gratings (e.g., a Bragg grating) in portions of underlying and/or non-underlying segments 117, 162 of the waveguide 110.

Figure 2B:
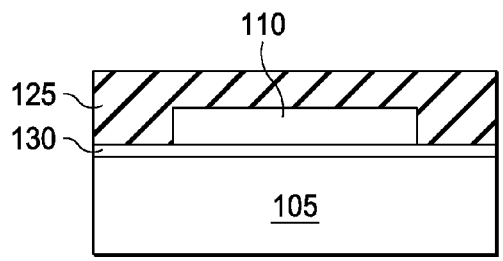
Figure 3B:
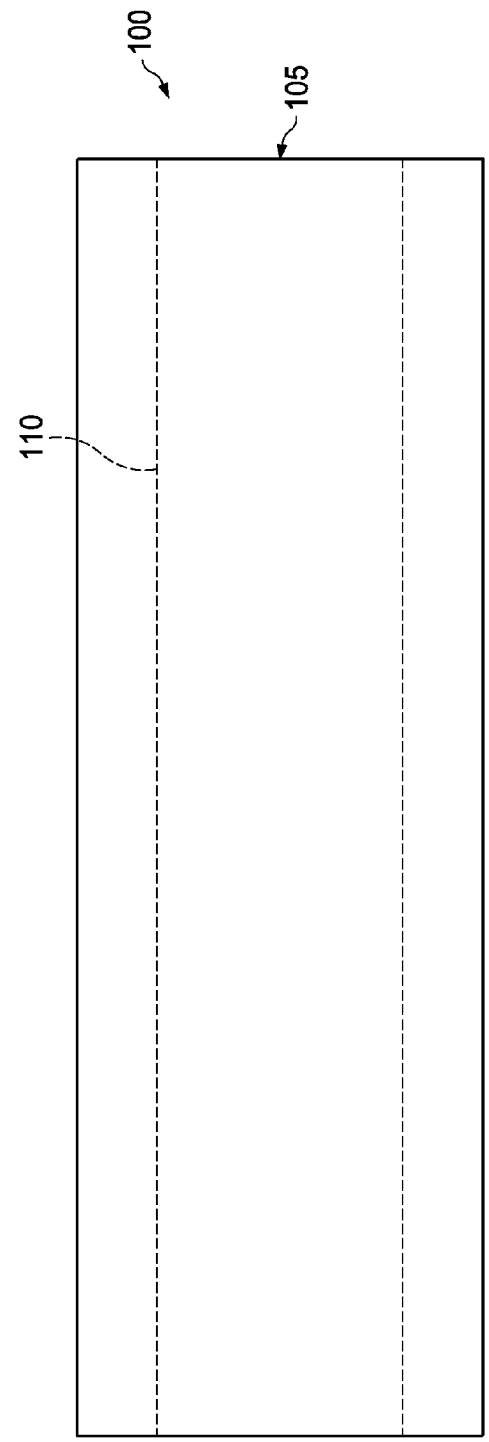

Some embodiments of the method can further include a step 415 of depositing a dielectric layer 130 on the substrate 105 wherein the dielectric layer 130 covers the silicon waveguide 110 (e.g., FIGS. 2B and 3B). The dielectric layer 130, can be formed by any conventional process in which a dielectric material, such as silicon oxide, is deposited over the substrate 105 and waveguide 110.

Figure 2C:
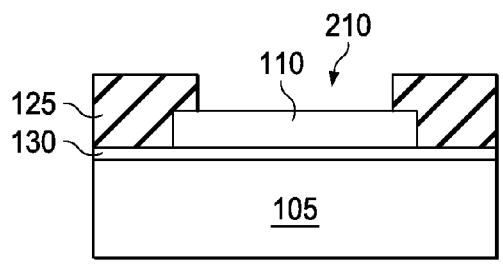
Figure 2D:
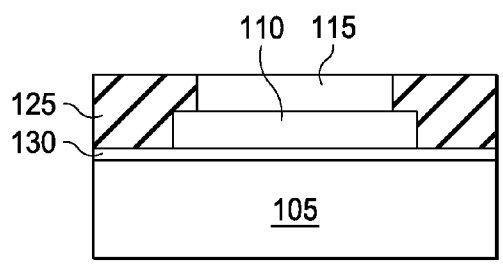
Figure 3C:
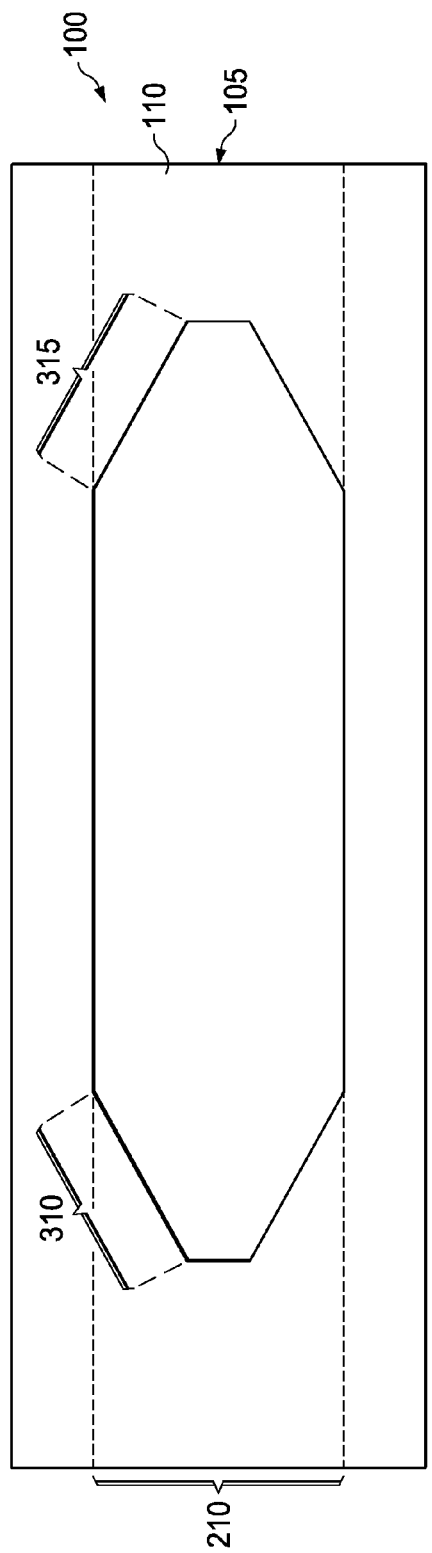
Figure 3D:
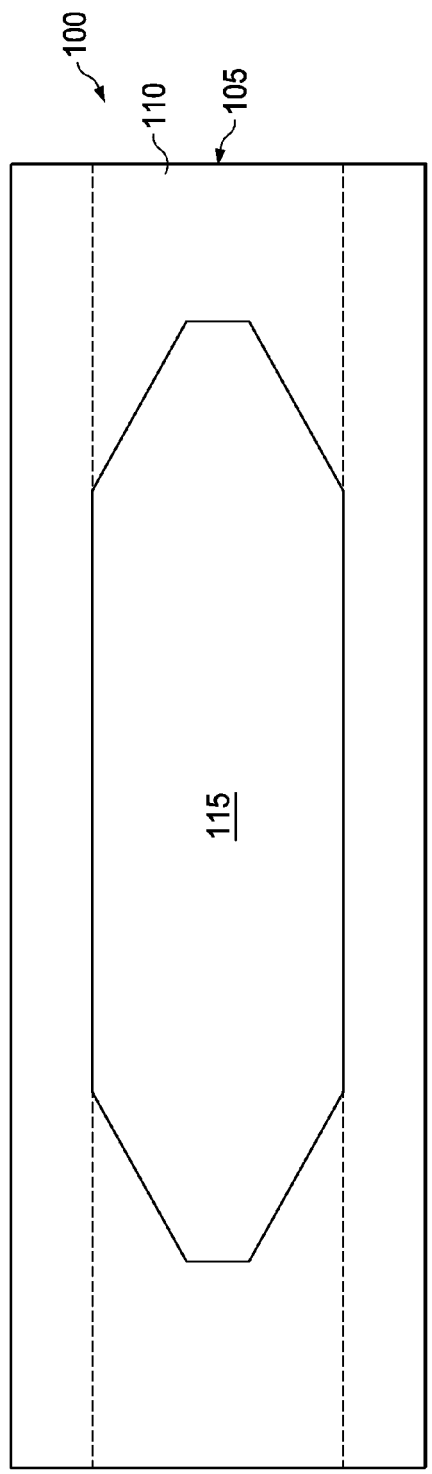

Some embodiments can further include a step 420 of patterning the dielectric layer to form a trench 210 (e.g., FIGS. 2C and 3C) there-through where the trench 210 defines the shape of the semiconductor layer such a discussed elsewhere herein. The patterning step 420 can include conventional lithographic and etching procedures familiar to those skilled in the pertinent art. As illustrated in FIG. 2C, in some embodiments the trench 210 can be formed such that trench 210 lays entirely within a perimeter of the waveguide 110, and in some embodiment within a segment 117 of the waveguide 110 having an increased thickness 160 as compared to other segments 164 of the waveguide 110. As illustrated in FIG. 3C, in some embodiments, the trench 210 includes at least one tapered end segment 310, and in some embodiments two tapered end segments 310, 315.

The method comprises a step 425 of depositing or growing a semiconductor layer 115 with a direct band gap on a segment 117 of the silicon waveguide 110, the semiconductor layer 115 and segment 117 forming part of a hybrid optical waveguide 120. The direct band gap material of the layer 115 can be deposited by conventional chemical or physical deposition processes such as plasma-enhanced chemical vapor deposition or grown by other epitaxial growth processes familiar to those skilled in the pertinent art. In some embodiments, depositing the semiconductor layer 115 in step 425 includes depositing or growing, in step 427, the direct band gap material into the trench 210 formed in the dielectric layer 130 located on the substrate 105 and surrounding the silicon waveguide 110 (e.g., FIGS. 2D and 3D).

Figure 2E:
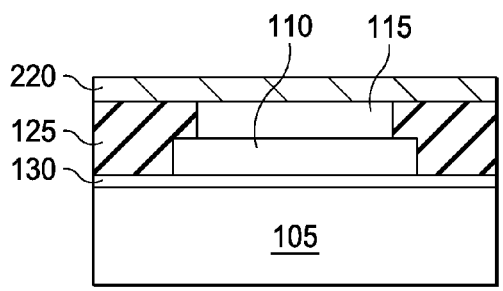
Figure 3E:
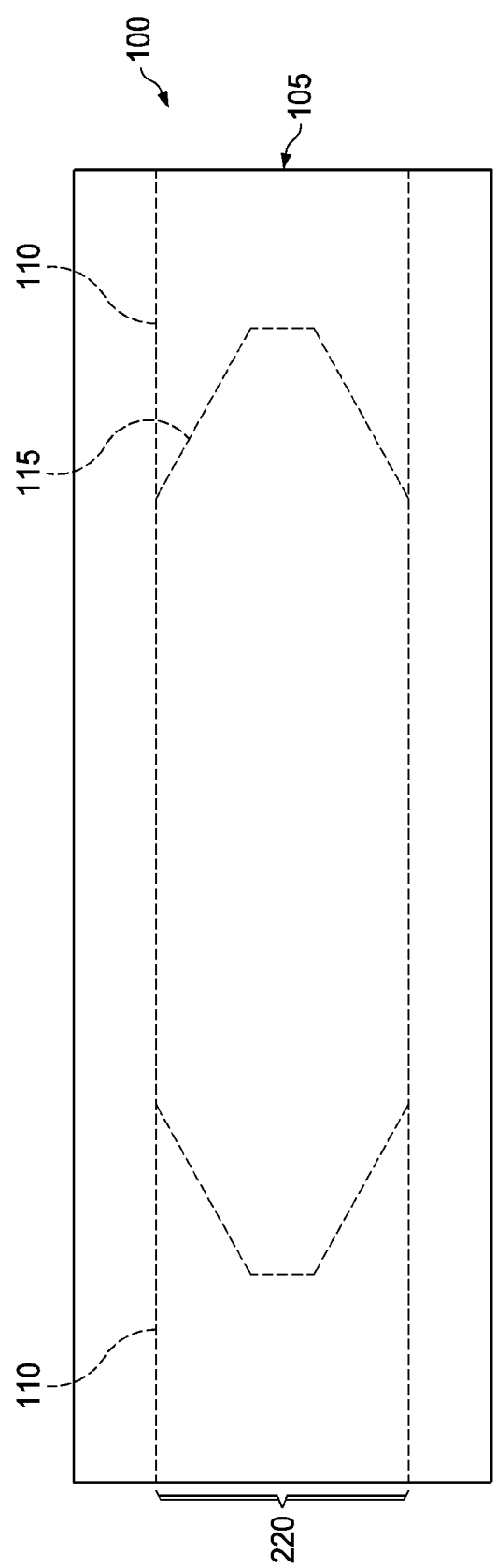

Some embodiments can further include a step 430 of forming a metal layer 220 (e.g., a metal electrode contact) on the semiconductor layer 115 (e.g., FIGS. 2E and 3E). Non-limiting examples of forming the metal layer in include physical or vapor deposition, electro-deposition, electroless or similar process familiar to one skilled in the pertinent art. Those skilled in the pertinent art would understand how the metal layer 220 could be connected to a voltage source to provide the electrical bias conditions to facilitate stimulated emission of the semiconductor layer 115.

Although the present disclosure has been described in detail, those skilled in the art should understand that they can make various changes, substitutions and alterations herein without departing from the scope of the invention.

What is claimed is:

1. An apparatus, comprising
a substrate having a silicon waveguide thereon;
a silicon and germanium alloy semiconductor layer or a germanium semiconductor layer, the semiconductor layer constructed to provide stimulated emission under electrical bias conditions; and wherein:
the semiconductor layer is located on a segment of the silicon waveguide and the semiconductor layer and the silicon waveguide are in a hybrid optical waveguide, and
a vertical thickness of the segment of the silicon waveguide underlying the semiconductor layer is greater than vertical thicknesses of other segments of the silicon waveguide that do not underlay the semiconductor layer, wherein the vertical thickness and the vertical thicknesses are in a dimension perpendicular to a surface of the segment of the silicon waveguide facing the semiconductor layer.

2. The apparatus of claim 1, wherein the silicon waveguide is located on a planar surface of an oxide layer.

3. The apparatus of claim 1, wherein the silicon waveguide is part of a silicon substrate.

4. The apparatus of claim 1, wherein the semiconductor layer is located directly on and in contact with the silicon waveguide.

5. The apparatus of claim 1, wherein the hybrid optical waveguide is capable of providing optical amplification at wavelengths of an optical fiber communications band.

6. The apparatus of claim 1, wherein a lateral width of at least one end segment of the semiconductor layer forms a tapered end segment.

7. The apparatus of claim 6, wherein both ends of the semiconductor layer are tapered.

8. The apparatus of claim 6, wherein a lateral width of a portion of the silicon waveguide laying adjacent to the tapered end segments is tapered.

9. The apparatus of claim 1, further including a buffer layer located in between the semiconductor layer and the silicon waveguide, wherein the buffer layer includes at least one element also present in the semiconductor layer.

10. The apparatus of claim 1, wherein the silicon waveguide is located within a photonic integrated circuit component.

11. A method of manufacturing an apparatus, comprising:
providing a silicon layer on a substrate;
growing a vertical thickness of a segment of the silicon layer;
patterning the silicon layer to form a silicon waveguide located on a substrate; and
depositing or growing a silicon and germanium alloy semiconductor layer or a germanium semiconductor layer on the segment the silicon waveguide, the semiconductor layer and the segment forming part of a hybrid optical waveguide, wherein:
the semiconductor layer is constructed to provide stimulated emission under electrical bias conditions, and
the vertical thickness of the segment underlying the semiconductor layer is greater than vertical thicknesses of other segments of the silicon waveguide that do not underlay the semiconductor layer, wherein the vertical thickness and the vertical thicknesses are in a dimension perpendicular to a surface of the segment of the silicon waveguide facing the semiconductor layer.

12. The method of claim 11, further including:

depositing a dielectric layer on the substrate wherein the dielectric layer covers the silicon waveguide; and patterning the dielectric layer to form a trench therein wherein the trench defines the shape of the semiconductor layer.

13. The method of claim 12, wherein the trench includes at least one tapered segment.

14. The method of claim 12, wherein the dielectric layer is a silicon oxide layer.

15. The method of claim 11, wherein depositing the semiconductor layer includes depositing or growing the semiconductor layer in a trench formed in a dielectric layer located on the substrate and surrounding the silicon waveguide.

* * * * *